(12) United States Patent
Morgan

(10) Patent No.: US 8,164,157 B2
(45) Date of Patent: Apr. 24, 2012

(54) SIGNAL ABSORPTION INDUCTION CIRCUIT

(76) Inventor: David Robert Morgan, Conroe, TX (US)

( * ) Notice: Subject to any disclaimer, the term of this patent is extended or adjusted under 35 U.S.C. 154(b) by 940 days.

(21) Appl. No.: 12/180,539

(22) Filed: Jul. 27, 2008

(65) Prior Publication Data

US 2010/0020987 A1    Jan. 28, 2010

(51) Int. Cl.
*H01L 27/08* (2006.01)
(52) U.S. Cl. . 257/531; 257/277; 257/499; 257/E21.022; 257/E45.001; 330/63
(58) Field of Classification Search ............... 257/277, 257/499, 531, E21.022, E45.001; 330/63
See application file for complete search history.

(56) References Cited

U.S. PATENT DOCUMENTS

| 4,649,565 | A | * | 3/1987 | Kaizer et al. | 381/96 |
| 5,973,367 | A | * | 10/1999 | Williams | 257/365 |
| 5,986,617 | A | * | 11/1999 | McLellan | 343/860 |
| 6,737,301 | B2 | * | 5/2004 | Eden et al. | 438/128 |
| 7,671,372 | B2 | * | 3/2010 | Morikawa | 257/81 |
| 2002/0041205 | A1 | * | 4/2002 | Oppelt | 330/61 A |
| 2005/0269657 | A1 | * | 12/2005 | Dupuis | 257/446 |
| 2006/0279966 | A1 | * | 12/2006 | Fan et al. | 363/17 |

* cited by examiner

*Primary Examiner* — Kimberly Nguyen
*Assistant Examiner* — Duy Nguyen

(57) ABSTRACT

This patent pertains to a new technique of increasing the amount of energy absorbed by an antenna. It accomplishes this by broadcasting a spike that attracts the signal when the fields of its oscillating charge are at their strongest.

9 Claims, 4 Drawing Sheets

SIGNAL ABSORPTION INDUCTION CIRCUIT

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

The invention is a type of signal amplifier that uses electromagnetic induction to boost the signal received from either an electromagnetic source, or an acoustic source.

BRIEF SUMMARY OF THE INVENTION

The invention amplifies a signal using timed pulses of high voltage spikes to induce said signal. These pulses are timed so that they occur when the signal is near its peak voltage. The pulses are generated in a polarity that causes the signal to be attracted to said pulses. The signal energy is then drawn off into a secondary circuit. This may be used to boost a weak signal, or to absorb power from the signal source. Applications exist in radio technology, energy production, and sound amplification or cancellation.

BRIEF DESCRIPTION OF THE DRAWINGS

FIG. 1-B: This depicts the portion of the signal that is received by the primary of the first transformer of the circuit. The ticks are every pi/2 radians of the signal frequency.

FIG. 1-C: This depicts the signal generated by the secondary of the first transformer of the circuit. The ticks are every pi/2 radians of the signal frequency.

FIG. 1-D: This depicts the signal source combined with the voltage spikes from the secondary of the first transformer. The ticks are every pi/2 radians of the signal frequency.

FIG. 2-B: This depicts the logic state of the "B" touch points of FIGS. 3 and 4. The ticks are every pi/2 radians of the signal frequency.

FIG. 2-C: This depicts the logic state of the "C" touch points of FIGS. 3 and 4. The ticks are every pi/2 radians of the signal frequency.

FIG. 2-D: This depicts the logic state of the "D" touch points of FIGS. 3 and 4. The ticks are every pi/2 radians of the signal frequency.

DETAILED DESCRIPTION OF THE INVENTION

Figure 1:
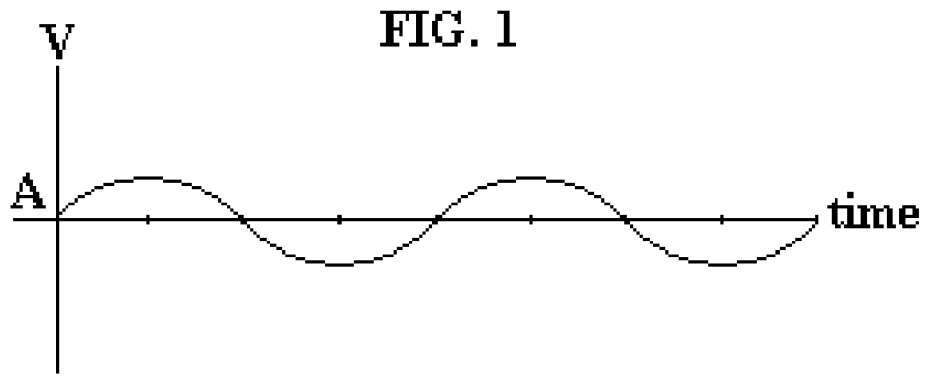
FIG. 1-A: This depicts the signal source that is intended to be amplified. The ticks are every pi/2 radians of the signal frequency.
Figure 1:
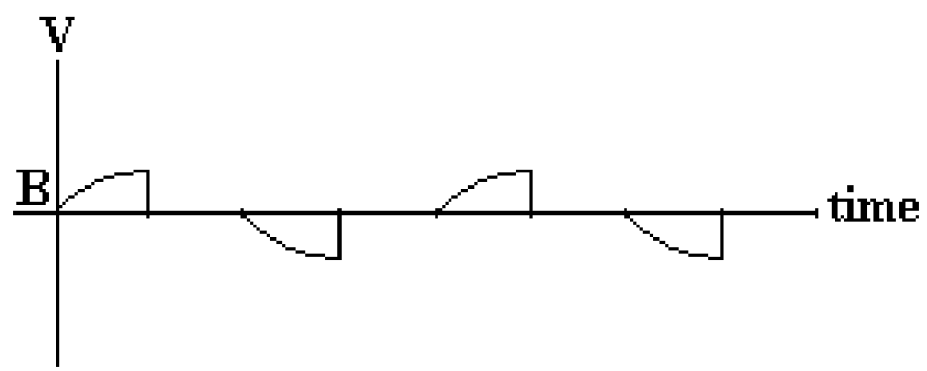
Figure 1:
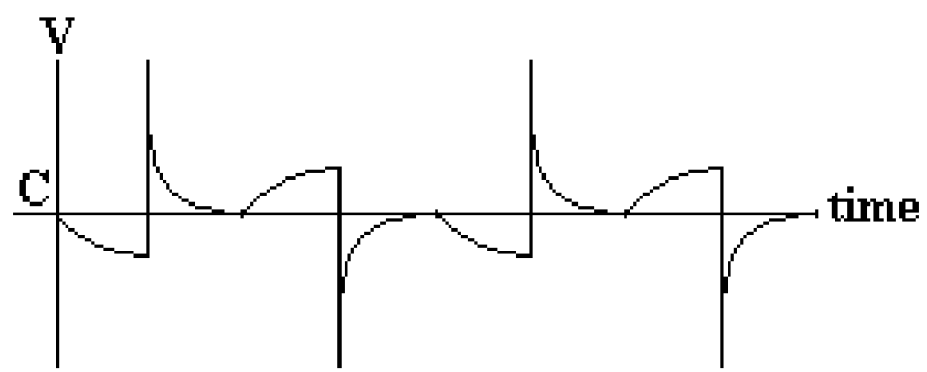
Figure 1:
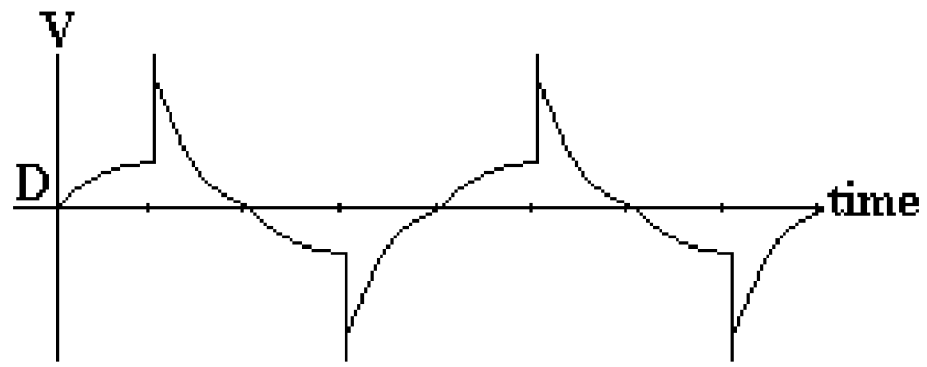
Figure 2:
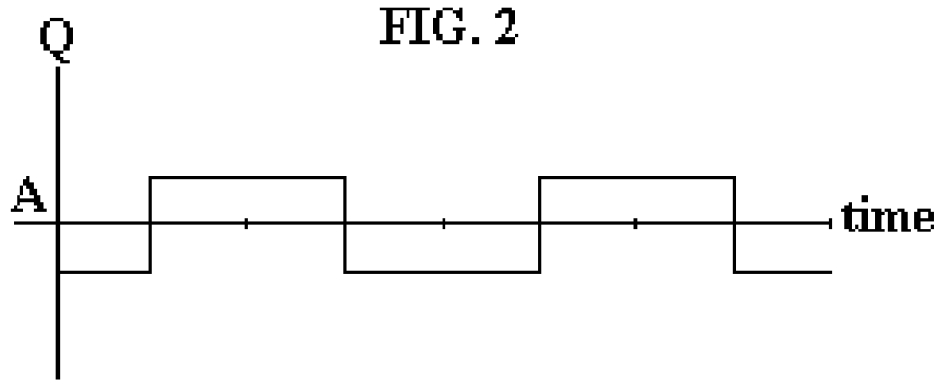
FIG. 2-A: This depicts the logic state of the "A" touch points of FIGS. 3 and 4. The ticks are every pi/2 radians of the signal frequency.
Figure 2:
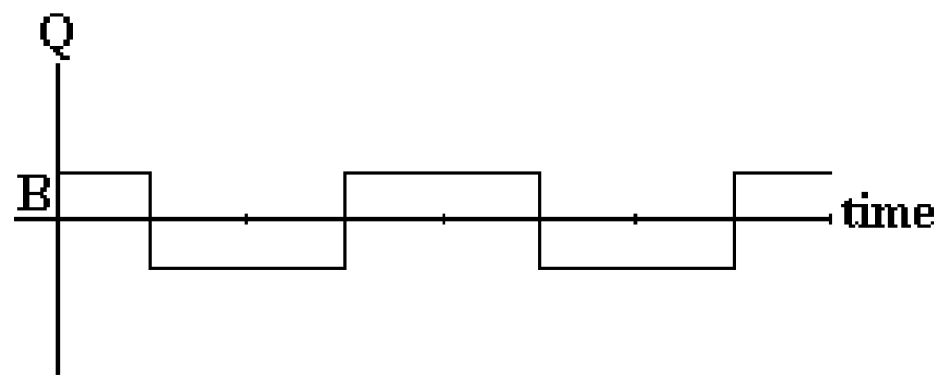
Figure 2:
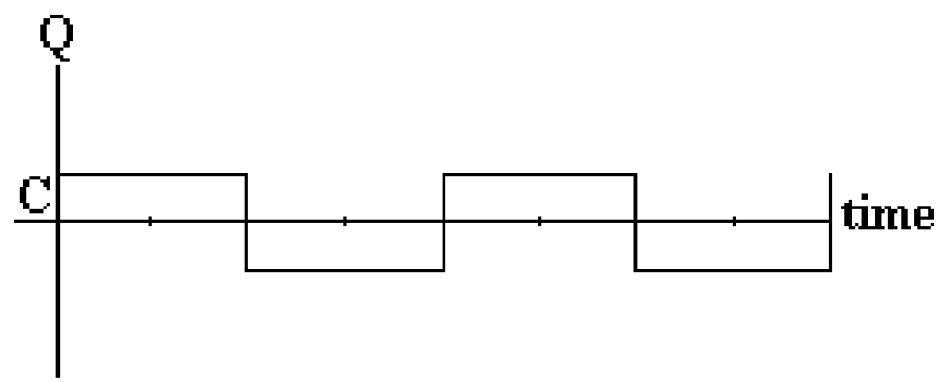
Figure 2:
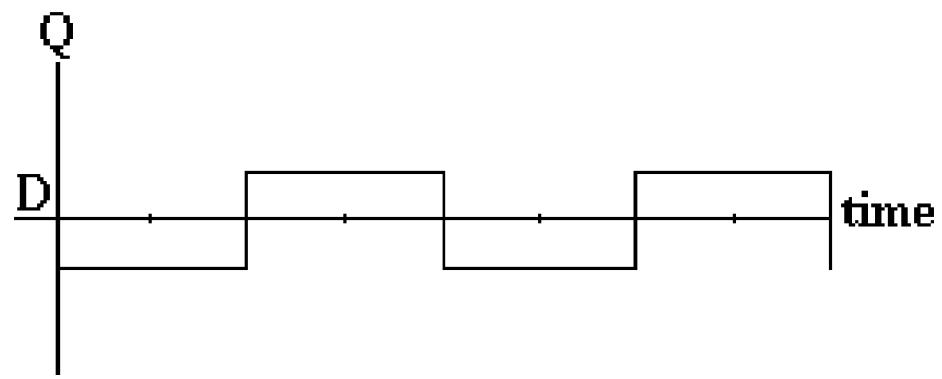
Figure 3:
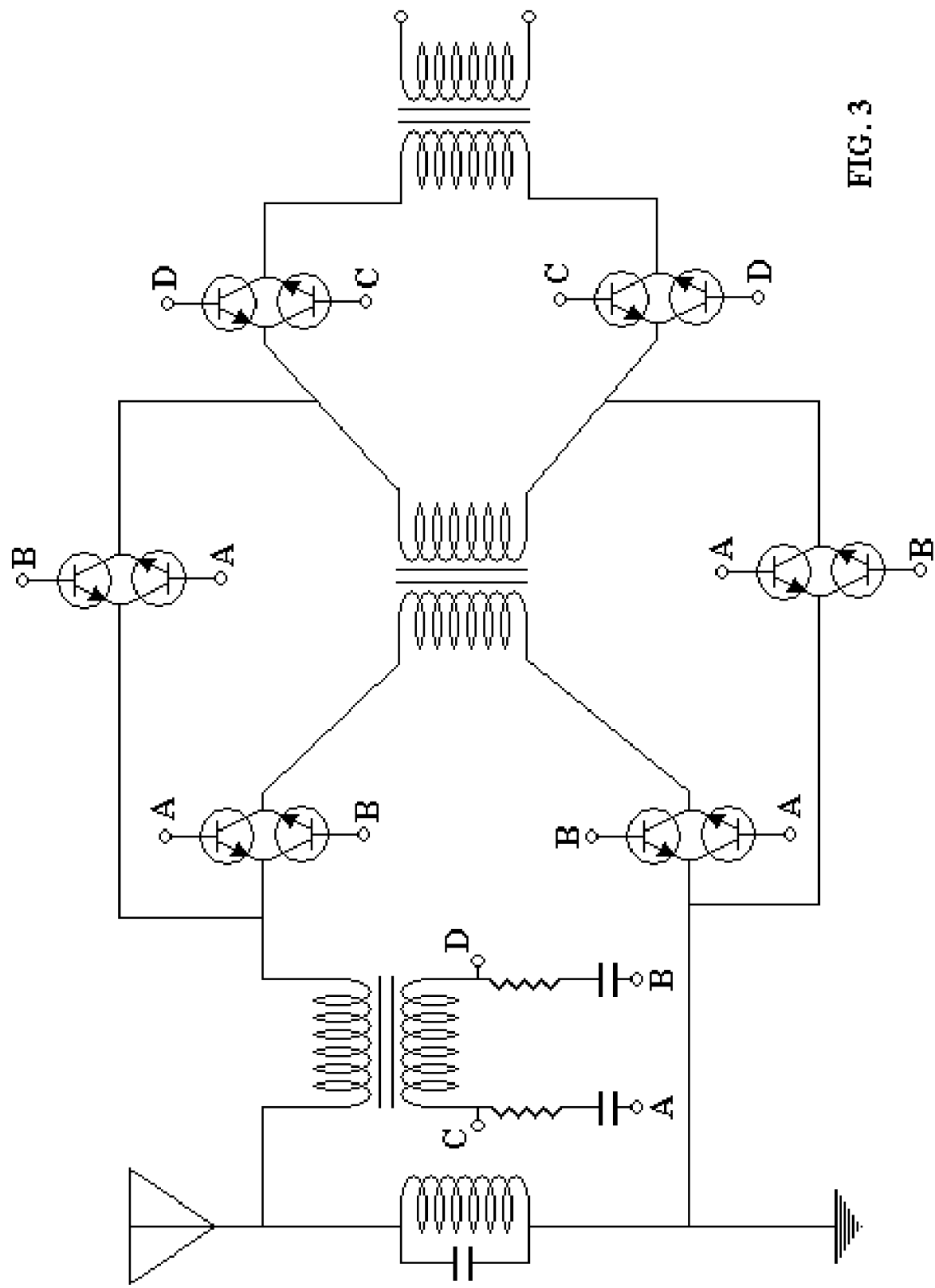
FIG. 3: This is a schematic of the circuit as implemented with NPN transistors and using capacitors to phase shift the signal. All touch points labeled "A" are connected to each other. All touch points labeled "B" are connected to each other. All touch points labeled "C" are connected to each other. All touch points labeled "D" are connected to each other.
Figure 4:
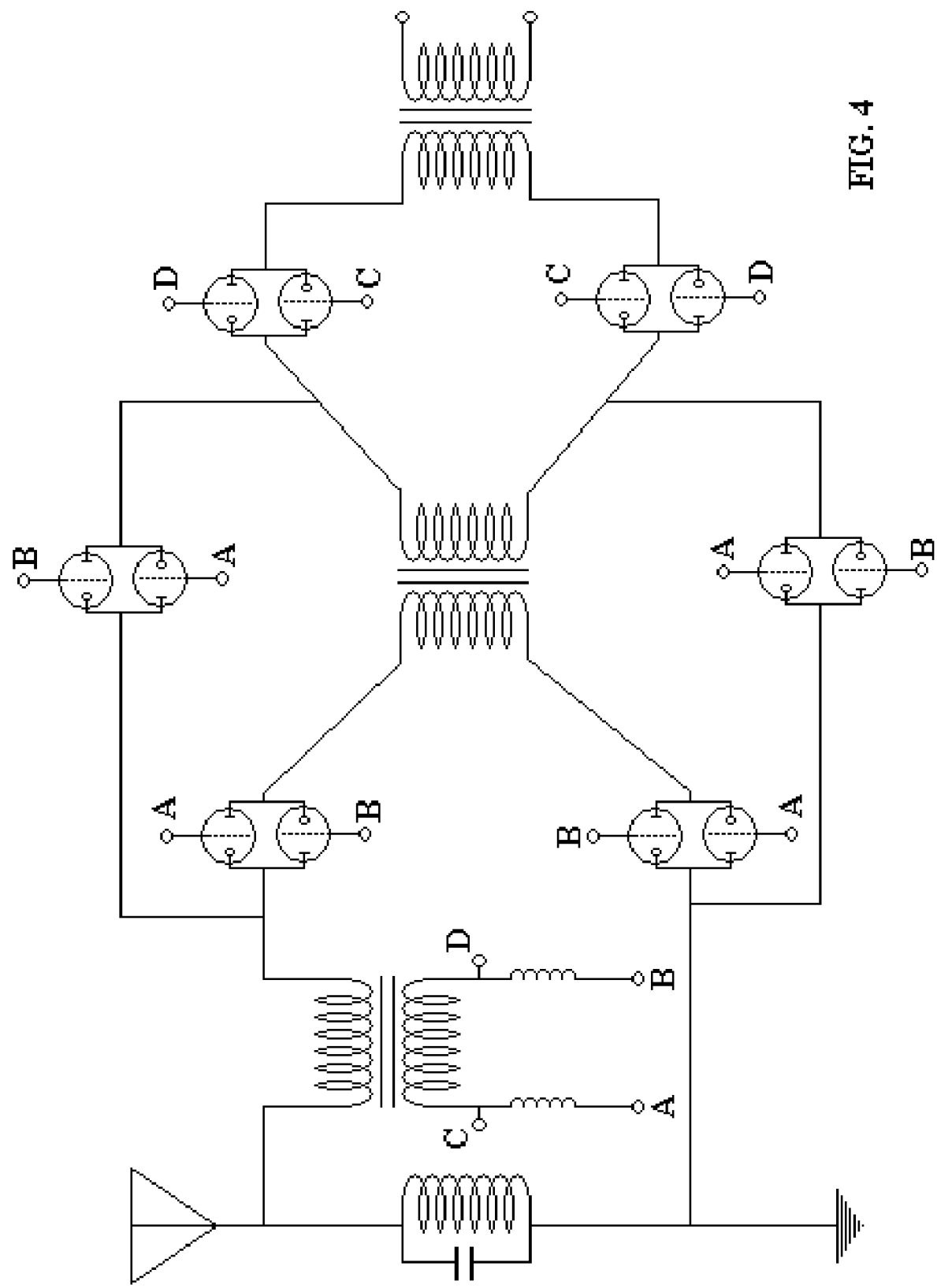
FIG. 4: This is a schematic of the circuit as implemented with krytrons and using inductors to phase shift the signal. All touch points labeled "A" are connected to each other. All touch points labeled "B" are connected to each other. All touch points labeled "C" are connected to each other. All touch points labeled "D" are connected to each other.

A signal that emanates from an electromagnetic source or an acoustic source is routed through the primary of a transformer. When the signal reaches its peak, then it is interrupted. This causes a voltage spike in the secondary of the same transformer. This voltage spike is shunted back to the signal source with a polarity that draws the current in the same direction as the original current of the signal. This spike occurs when the electric and magnetic fields of the charged particles of the signal are at their strongest. This spike attracts the charged particles of the signal. The output of the secondary coil of the transformer for the period between the signal's changing of polarity and its reaching its peak can be harnessed, if the harnessing circuit is isolated from the secondary during the voltage spike, so that the harnessing circuit doesn't ground the secondary during the spike.

A key aspect to this invention is the timing of the three events: the interruption on the primary, the shunting of the voltage spike, and the isolation of the harnessing circuit. The timing of these must come from the signal itself, but any method used must not be modified by the effect of the voltage spike. To accomplish this we place a transformer in series with the circuit. This provides us a signal that is not diminished by the voltage spike. We then use two capacitors, or optionally two inductors, to shift the phase of the signal by 90 degrees. This phase shifted signal is used to time the interruption of the primary and the shunting of the voltage spike. The timing for the isolation of the harnessing circuit is in phase with the signal.

Effectively, this circuit sends out a canceling wave. This does not cause the destruction of the energy of the signal, nor does it create extra energy within the circuit. It simply transfers the energy from one to the other, via the principle of induction.

The methods of interrupting the primary, shunting the voltage spike, and isolating the harnessing circuit may be any of the known methods of electrically or mechanically regulating the flow of current. The examples provided in this patent include krytrons (a form of vacuum tube), and transistors, although these and any other means of electrically or mechanically controlling the direction of the flow of current may be used in any combination that provides the same interruption of the primary, shunting of the voltage spike, and isolation of the harnessing circuit.

The method of shifting the phase of the signal by 90 degrees may be accomplished by using capacitors in series, using inductors in series and inverting the output, or by using digital signal processing.

The invention claimed is:

1. A method of amplifying signals, from electromagnetic sources of energy, or from two-way electric/acoustic bridges to acoustic sources of energy, by emitting pulses of high voltage current within pi/4 radians of the peak of the signal, where said pulses are aligned with the phase of the signal to have current in the same direction as that of the signal-induced current, such that the pulse emitted attracts the charged particles from the signal source; for the purpose of extracting energy from the signal source, absorbing it, and converting it to a usable form.

2. A circuit comprised of a transformer, henceforth referred to as the pulse transformer, having a primary through which a signal is routed for the first pi/2 radians of the signal frequency, which when it is at near pi/2 radians of the signal frequency, has the current through the primary of the pulse transformer interrupted via two switches that regulate the direction of current, henceforth referred to as the interrupt switches, which then switch direction to only allow current through the primary in the opposing direction, such that the collapsing magnetic field of the primary induces a strong voltage spike in the pulse transformer's secondary coil, which is shunted back to the outside of the interrupt switches on the primary side through another set of switches that regulate the direction of current along said shunt, henceforth referred to as the shunt switches, such that said voltage spike draws the current that was interrupted from the signal source, and thereby inducing the current from the signal source, and also comprised of two switches connected to the secondary, henceforth referred to as the harness switches, that allow current from the secondary to be routed to a harnessing circuit such as a transformer or rectifier without interfering with the voltage spike's drawing of the signal current, and finally comprised of some means of timing the operations of the switches.

3. The circuit of claim 2 where the means of timing the operating of the switches is comprised of a transformer, henceforth referred to as the timing transformer, that is placed in series with the pulse transformer, having output from its secondary drive the timing of the harness switches, and then phase shifting the output of the secondary of the timing transformer by pi/2 radians of the input signal, by use of a capacitor on each side of the secondary, which is then used to time the interrupt switches and the shunt switches.

4. The circuit of claim 2 where the means of timing the operating of the switches is comprised of a transformer, henceforth referred to as the timing transformer, that is placed in series with the pulse transformer, having output from its secondary drive the timing of the harness switches, and then phase shifting the output of the secondary of the timing transformer by pi/2 radians of the input signal, by use of an inductor on each side of the secondary and inverting the signal, which is then used to time the interrupt switches and the shunt switches.

5. The circuit of claim 2 where the means of timing the operating of the switches is comprised of a microcontroller that converts the signal input and the shunted voltage spikes into output to drive the timing of the harness switches, the interrupt switches and the shunt switches, via known methods of digital signal processing.

6. The circuit of claim 2 where the means of switching the direction of current is via coupled transistors that are arranged so that one transistor allows current in one direction when its base is signaled and the other allows current in the opposite direction when its base is signaled.

7. The circuit of claim 2 where the means of switching the direction of current is via coupled triodes that are arranged so that one triode allows current in one direction when the grid of that triode is uncharged and the other allows current in the opposite direction when the grid of that triode is uncharged.

8. The circuit of claim 2 where the means of switching the direction of current is via coupled relays and diodes such that one relay and diode allows current in one direction when it is closed and another relay and diode allows current in the opposite direction when it is closed.

9. The circuit of claim 2 where the means of switching the direction of current is via coupled krytrons that are arranged so that one krytron allows current in one direction when the grid of that krytron is uncharged and the other allows current in the opposite direction when the grid of that krytron is uncharged.

* * * * *